United States Patent
Solar et al.

(10) Patent No.: US 8,063,626 B2
(45) Date of Patent: Nov. 22, 2011

(54) METHOD FOR THE PRECISE MEASUREMENT OF DEPENDENCY ON AMPLITUDE AND PHASE OF PLURALITY OF HIGH FREQUENCY SIGNALS AND DEVICE FOR CARRYING OUT SAID METHOD

(75) Inventors: Borut Solar, Skofja Ioka (SI); Primoz Lemut, Tolmin (SI); Vladimir Poucki, Kostolac (RS); Borut Baricevic, Koper (SI); Tomaz Karcnik, Ljubljana (SI)

(73) Assignee: Instrumentation Technologies d.d., Solkan (SI)

( * ) Notice: Subject to any disclaimer, the term of this patent is extended or adjusted under 35 U.S.C. 154(b) by 259 days.

(21) Appl. No.: 12/465,873

(22) Filed: May 14, 2009

(65) Prior Publication Data
US 2009/0295365 A1  Dec. 3, 2009

(30) Foreign Application Priority Data
May 30, 2008  (SI) ................... P200800138

(51) Int. Cl.
*G01N 27/00* (2006.01)
*G01N 27/28* (2006.01)
(52) U.S. Cl. .. 324/73.1; 324/605; 324/607; 324/765.01; 702/108; 702/115
(58) Field of Classification Search ............... 324/73.1, 324/600–727; 702/108–126
See application file for complete search history.

(56) References Cited

U.S. PATENT DOCUMENTS

| | | | |
|---|---|---|---|
| 5,001,416 A | 3/1991 | Bittner et al. | |
| 6,972,552 B2 | 12/2005 | Ursic | |
| 2006/0259197 A1* | 11/2006 | Boe et al. | 700/246 |

* cited by examiner

*Primary Examiner* — Huy Q Phan
*Assistant Examiner* — Emily Chan
(74) *Attorney, Agent, or Firm* — Beem Patent Law Firm

(57) ABSTRACT

The present invention refers to a method for the precise measurement of dependency on amplitude and phase of a plurality of high frequency signals, preferably in the synchrotron accelerator of elementary particles. The essence of the solution according to the invention lies in that with a single measuring device and without any aliasing it is achieved a resolution of 0.2 micron and repeatability of measurements of 1 micron down to the lower frequency limit of a few MHz. A method according to the invention includes alternately directing, with a radio frequency (RF) switch, each analogue input signal to each of a plurality of RF processing units; amplifying each analogue input signal in each RF processing unit in order to adjust signals to the measuring range of a plurality of analog-digital (A/D) converters; directing each amplified analogue input signal to each of a plurality of A/D converters; converting the analogue signals to digital signals; directing the digital signals to a digital corrector; correcting the digital signals by means of correcting signals from the inverse models of evaluated systematic errors; collecting corrected digital signals in a digital switch and directing the ordered recombined number of digital signals to each of a plurality of digital receivers; and filtering the recombined number of digital signals in a plurality of low-pass filters.

16 Claims, 1 Drawing Sheet

US 8,063,626 B2

METHOD FOR THE PRECISE MEASUREMENT OF DEPENDENCY ON AMPLITUDE AND PHASE OF PLURALITY OF HIGH FREQUENCY SIGNALS AND DEVICE FOR CARRYING OUT SAID METHOD

CROSS-REFERENCE TO RELATED APPLICATIONS

This application claims the benefit of priority from Slovenia patent application number SI P200800138, filed May 28, 2008.

BACKGROUND OF THE INVENTION

1. Field of the Invention

The present invention refers to a method for the precise measurement of dependency on amplitude and phase of a plurality of high frequency signals, preferably in the synchrotron accelerator of elementary particles, and a device for carrying out said method.

2. Description of the Related Art

Modern synchrotron accelerators of elementary particles, and in particular the sources of the synchrotron light, set up very strict demands as to the accuracy, repeatability and resolution when measuring the position of the accelerated elementary particles in the direction transversal to the direction of motion thereof. Said measurements must particularly meet requirements of sub micron resolution, of high accuracy which is independent of the current intensity of the accelerated particles, of repeatability of measurements during a longer period of time, of the uninterrupted transmission of measurements in real time during the regular operation of the accelerator, and of transmitting of a plurality of series broadband measurements with the sampling frequency that generally exceeds a million samples per second. Said measurements are of vital importance at the startup of the accelerator, and an indispensable diagnostic when optimizing and studying the operation of the accelerator.

Multichannel measuring devices mostly do their job with success; however, they share a common disadvantage reflecting in intermittence and time variability of transfer functions of each channel resulting in limiting the repeatability of measurements. In the document U.S. Pat. No. 5,001,416 there is disclosed a solution which has solved the required repeatability of the orbit position by means of time division multiplexing. The drawback of said solution lies in the narrow frequency bandwidth of the measuring device allowing only a slow correction of the orbit. In addition, due to the nature of the time division multiplexing said device disclosed in U.S. Pat. No. 5,001,416 is susceptible to unwanted mapping of the frequency band. All the recurrent effects of the synchrotron accelerator in the frequency range above the period of the time division multiplex may coincide distorting therewith the information about the real orbit.

Further on, in the document U.S. Pat. No. 6,972,552 there is described a non-multiplexing four channel measuring method for comparing the amplitudes of high frequency signals which removes the disadvantage of frequency mapping. It consists of four channel high frequency analogue amplifier, analogue-digital (A/D) converter and digital calculating circuit for signal processing. The measuring device acquires the required precision and the symmetry of the input analogue part by means of switching the four amplifying channels for all four measured signals. By switching the channels the device figures out the differences of amplification thereof and takes them into account when calculating the position. Further on, the document U.S. Pat. No. 6,972,552 describes additional reducing of the remaining error by filtering the signals in the immediate proximity of the channel switching frequency and by aperiodic channel switching. The filtering procedure, however, additionally reduces the error but at the same time makes the measuring device insensible in the same frequency range. On the contrary, the procedure of frequency distribution of errors by aperiodic channel switching preserves the sensibility of the measuring device but it does not remove the remaining error. Ideally, this solution would require very frequent channel switching which, however, is in contradiction with the disadvantage of the described method that causes the transition effect every time the channels switch. The error produced therein is proportional to the frequency of switching.

BRIEF SUMMARY OF THE INVENTION

The object of the present invention is to provide a method for the precise measurement of dependency on amplitude and phase of a plurality of high frequency signals, preferably with a synchrotron accelerator of elementary particles, free from the prior art drawbacks.

Further object of the invention is to provide a device for carrying out said method.

BRIEF DESCRIPTION OF DRAWINGS

Device for carrying out the method according to the invention will be described in details hereinafter with references to the accompanying FIG. 1 that shows a block scheme of the measuring device.

DETAILED DESCRIPTION OF THE INVENTION

Figure 1:
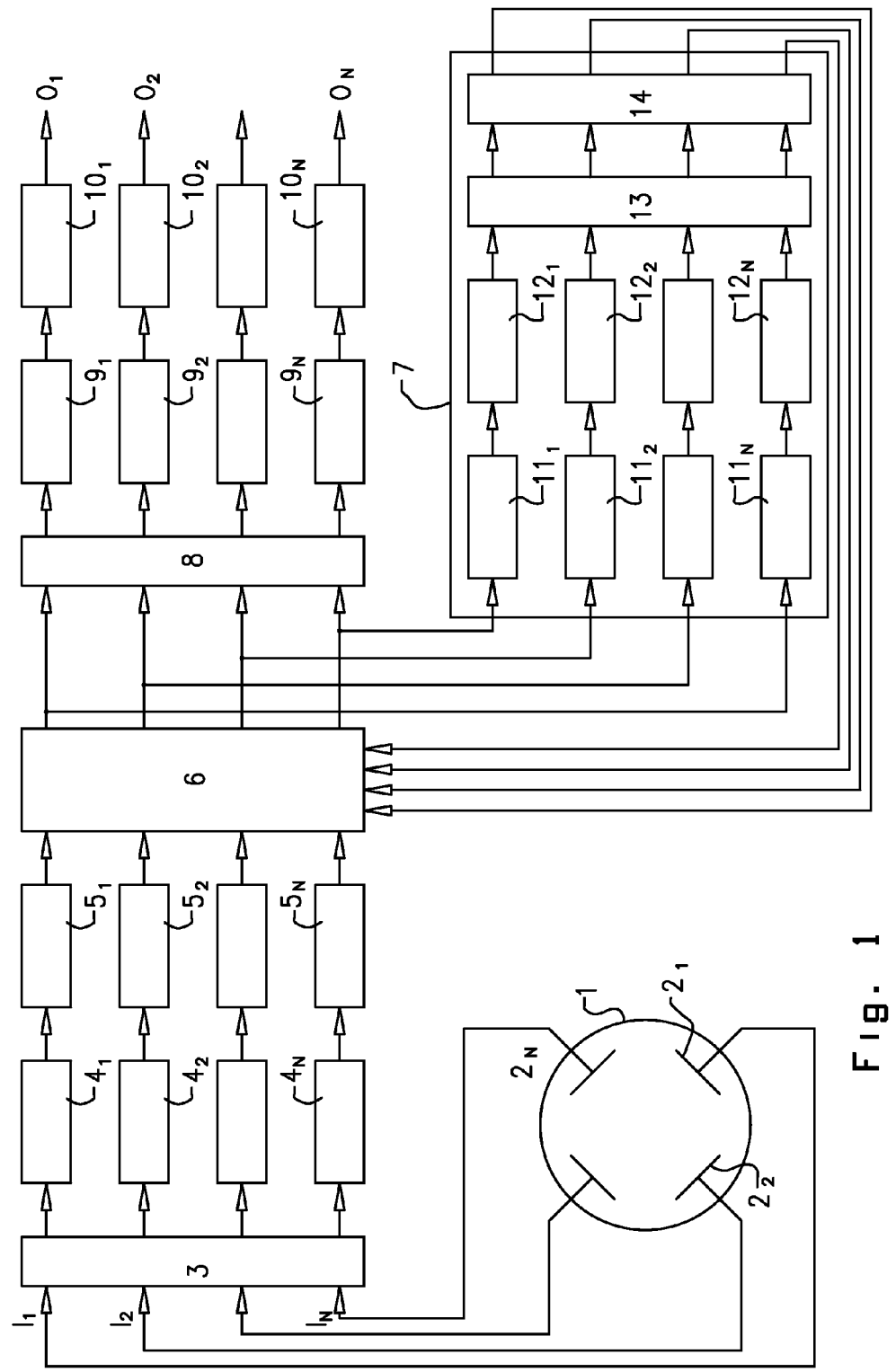

The essence of the solution according to the invention lies in that in the measuring device the error, which is the consequence of the transition effects caused by channel switching, is reduced. Consequently, the solution allows increasing of the switching frequency and thus higher frequency band of the measuring device. According to the invention the correction inverse model, with which the sampled values are digitally corrected, is determined on the basis of identification for the beam position calculation relevant distortions and differences between separate radio frequency (RF) units with belonging A/D converters.

A method for the precise measurement of dependency on amplitude and phase of a plurality of high frequency signals comprises a cyclic connection by means of a RF switch of each from a plurality of input signals produced by accelerator electrodes symmetrically arranged e.g. In an evacuated tube of the synchrotron accelerator of elementary particles with each from a plurality of RF processing units. Here, the cyclic connection is sequentially independent until each RF input is associated with each of the plurality of RF processing units within equally long time slots. Each analogue input signal is equally represented over the time in each RF processing unit. Input analogue signals are in pairs simultaneously present in an arbitrary combination of different pairs of signals at the output from the RF switch.

According to the invention, sequences of the state of the RF switch are cyclic whereas the speed of the rotation of switching is such that components of asymmetry of amplification in output digital signals are eliminated by filtering using a low-pass filter. Sequences of the state of the RF switch according to the invention could be acyclic in a wide frequency range lowering aliasing therewith.

Signals are further directed from each RF unit to a plurality of A/D converters. Each of the plurality of the RF processing units comprises tunable amplification and attenuation, respectively, resulting, due to the setting of all RF processing units to equal amplification, in the adjustment of an amplitude level of the strongest signal to the measuring scope of each A/D converter.

The output signal from each A/D converter is directed to a digital corrector which corrects the value of the digitalized input signal according to the instructions of the system for identification of important distortions and differences between amplifications of each RF unit with belonging A/D converters. In this group of sources of systematic errors belong the differences between amplifications of RF units, differences between phase shifts of the input signals, differences between phase shifts of RF units, crosstalk between separate RF units and non-linearities of separate A/D converters that significantly distort the measuring accuracy. The output signal from each digital corrector is transmitted to a digital switch by means of which the signal recombination is carried out. Said digital switch is synchronized with the RF switch in a manner that the first input signal is always processed in the first digital receiver, that the second input signal is always processed in the second digital receiver, and that the N-th input signal is always processed in the N-th digital receiver. There is corrugation in the output signals from the digital switch caused by imperfect correction of systematic errors at switching relevant to the measuring accuracy. Each signal from a plurality of digital receivers is further filtered in a plurality of low-pass filters, the bandwidth thereof having been chosen so that it is essentially lower than the switching frequency of switches and that at the same time the corrugation due to the imperfect correction is filtered out. Therewith, a vector signal averaging is achieved from the analogue part ensuring the mapping of the amplitude and phase ratio between the input signals to the output signal in a manner:

$$O_1/I_1 = O_2/I_2 = \ldots = O_N/I_N = G,$$

wherein $$G = (G_1 + G_2 + \ldots + G_N)/N$$

and wherein:
$I_1 \ldots I_N$ is the input signal,
$O_1 \ldots O_N$ is the output signal,
N is the number of individually measured signals,
$G, G_1 \ldots G_N$ is the transfer function of the RF process unit and the A/D converter.

Digital signals at the output of the digital correctors are corrected by means of correction signals from circuit for identification of the sources of systematic errors and modeling the inverse models. The correction signals are gained from the inverse model in a manner that digitized signals are lead directly after the digital corrector through a digital receiver to a low-pass filter, and afterward they are treated by means of a circuit which compares these signals among themselves and, in order to mutually adjust signals exiting A/D converter and entering the digital corrector, creates correction signals which are lead back to the digital corrector. The device for identification of systematic errors in this manner in every further step determines the remains of systematic error from previous correction. The device for modeling combines the previous correction model and the remain of the error and thus provides improved inverse model of systematic error for the next correction. The circuits for identification of systematic errors and for carrying out the inverse model are, in the same manner as the digital switch, synchronized with the RF switch, thus for every state of the RF switch an independent inverse correction model of each RF switch's state is built.

In the complex of multiple mentioned corrections the correction of different phase shifts of the input signals as well as different phase shifts of the separate RF units is especially important for reducing the random measuring error. The digital corrector in the contribution of phase correction all the time assures invariable phase of the signals at the output of the digital switch independently of the RF switch's state. The invariability of the digital signals' phase at the input of the digital receivers enables demodulation without the transition effects that enter the random measurement error into the measuring procedure. The mentioned error is thus the consequence of the operation of the RF switch and is proportional to the frequency of the switching of the said switch. The phase correction removes the random error of the transition effects in the low-pass filters attached to the outputs of the digital receivers, notwithstanding it does not remove the consequences of the transition effects in separate RF units due to the switching of the RF switch. This part is removed by the low-pass filters attached to the outputs of the digital receivers. Additional removing of the random error caused by from the RF unit arising transition effects is done, according to the invention, by substituting the measured values at the output of the digital corrector during the transition effect lasts with the values calculated from the signals' values before the transition effect.

The main characteristics of the present invention lie in multidimensional correction of the systematic errors. All the digital signals are amplified for the average amplification of all RF processing units while the phase shift of all signals remains constant irrespective of the choice of the RF unit for separate signal and the phase shift of the input signal. Further on, all digital signals before entering the digital corrector are for each selection of the RF processing unit offered in new linear combination at the output of the corrector which represents the crosstalk between the RF processing units. By the frequency analysis of the sampled signals in the range of the higher harmonic components of the input signal's carrier frequency the nonlinearities of the A/D converters are compensated. The procedure, according to the invention, is further distinguished for removing the random error due to the transition effect in the RF unit caused by switching of the RF switch in a manner that one part of the mentioned error is removed by a low-pass filter and the remaining part in the time space by removing the inaccurate values directly after switching of the RF switch. With stiffly synchronized sampling at constant phase shift of few angle degrees or few 10 ps between sampling signal and input signal the present invention assures repeatable error caused by the transition effect in the RF unit in a manner that it records it with the circuit for identification and subtracts it in the digital corrector.

Device for carrying out the method according to the invention will be described in details hereinafter with references to the accompanying figure that shows a block scheme of the measuring device.

A plurality of accelerator electrodes $2_1, 2_2, \ldots 2_N$ is symmetrically placed in an evacuated tube 1 of a synchrotron accelerator, said electrodes being arranged in a manner to measure in a transversal plane of the evacuated tube 1, and respectively, orbit of accelerated particles, potential difference of the electric field due to the electric charge of the accelerated elementary particles. Electric signals $I_1, I_2, \ldots I_N$ which are lead to a radio frequency (RF) switch 3 are induced in accelerator electrodes $2_1, 2_2, \ldots 2_N$ said switch being described in details below. A plurality of RF processing units $4_1, 4_2, \ldots 4_N$ with tunable amplification and attenuation, respectively, is connected to the RF switch 3, an analog-digital (A/D) converter $5_1, 5_2, \ldots 5_N$ follows each of said processing units. Tuning to an equal amplification of all the RF processing units the measuring device according to the invention adjusts the value of the amplitude of the highest signal $I_1, I_2, \ldots I_N$ to the measuring range of each A/D converter $5_1, 5_2, \ldots 5_N$. Digital signals exiting each A/D converter $5_1, 5_2, \ldots 5_N$ are then directed to a digital corrector 6 where the value of each digitized input signal is corrected according to the instructions of a system 7 for identification and calculation of correction signals for systematic errors relevant for measuring accuracy of selected RF unit $4_1, 4_2, \ldots 4_N$ with the respective A/D converter $5_1, 5_2, \ldots 5_N$.

Signals $I_1, I_2, \ldots I_N$ are transmitted from the digital corrector 6 to a digital switch 8 where a recombination of said signals is carried out, and afterwards said signals are transmitted to a plurality of digital receivers $9_1, 9_2, \ldots 9_N$ being associated with said switch 8. The digital switch 8 is synchronized with the RF switch 3 in a manner that regardless of the state of RF switch 3 the input signal $I_1$ is always processed in the digital receiver $9_1$, that the input signal $I_2$ is always processed in the digital receiver $9_2$, and that the input signal $I_N$ is always processed in the digital receiver $9_N$.

The system 7 for the identification of the systematic error of the separated RF processing unit $4_1, 4_2, \ldots 4_N$ with the respective A/D converter $5_1, 5_2, \ldots 5_N$ consists of a plurality of parallel digital receivers $11_1, 11_2, \ldots 11_N$ each input thereof is connected to the location of each transition from the digital receiver $9_1, 9_2, \ldots 9_N$ to a low-pass filter $10_1, 10_2, \ldots 10_N$. Said digital receivers $11_1, 11_2, \ldots 11_N$ are connected in a plurality of low-pass filters $12_1, 12_2, \ldots 12_N$ and the outputs of said low-pass filters are connected in parallel to the circuit 13 for identification of differences such as e.g. differences between amplifications, differences between input signals' phase shifts, differences between phase shifts in separate RF processing unit, crosstalk between separate RF processing units and nonlinearities of A/D converters. The outputs of the circuit 13 for the identification of systematic errors are connected to the circuit 14 for synthesis of inverse model of systematic errors, and the latter is connected back to the digital corrector 6.

The invention claimed is:

1. A method for precise measurement of the dependency on amplitude and phase of a plurality of high frequency signals obtained from accelerator electrodes, comprising the following steps:
    a) directing alternately by means of a radio frequency (RF) switch each of a plurality of analogue input signals to each of a plurality of RF processing units;
    b) amplifying the analogue input signals in the RF processing units in order to adjust the analogue input signals to the measuring range of a plurality of analog-digital (A/D) converters;
    c) directing the amplified analogue input signals to the plurality of A/D converters and converting the amplified analogue input signals to digital signals;
    d) directing the digital signals to a digital corrector;
    e) correcting the digital signals by means of correction signals from a circuit for synthesis of inverse model of systematic errors, wherein correcting signals from the circuit for synthesis of inverse model of systematic errors are obtained in a manner that the digitized signals are led directly after the digital corrector through the digital receiver to the low-pass filter where they are treated by means of a circuit which mutually compares the signals and, in order to identify the systematic errors of the signals exiting the A/D converter and entering the digital corrector, creates correcting signals which are directed back to the digital corrector;
    f) collecting digital signals exiting the digital corrector in a digital switch and directing an ordered recombined number of digital signals to a plurality of digital receivers; and
    g) filtering the recombined number of digital signals in a plurality of low-pass filters.

2. A method according to claim 1, wherein each analogue input signal is evenly represented over the time in each RF processing unit, and input analogue signals are processed in the RF switch in a manner that the input analogue signals are simultaneously present in an arbitrary combination of different pairs of signals on an output of the RF switch.

3. A method according to claim 1, wherein systematic error caused by nonlinearities of amplifications of the RF processing units is identified on the basis of mutual comparison between signals at the outputs from the low-pass filters at different positions of the RF switch.

4. A method according to claim 1, wherein phase shifts of the input signals are identified according to mutual comparison between signals at the outputs from the low-pass filters at different positions of the RF switch.

5. A method according to claim 1, wherein phase shifts of separate RF units are identified according to mutual comparison between signals at the outputs from the low-pass filters at different positions of the RF switch.

6. A method according to claim 1, wherein crosstalk between separate RF units is identified according to mutual comparison between signals at the outputs from the low-pass filters at different positions of the RF switch when the input signals are known.

7. A method according to claim 1, wherein nonlinearity of a separate A/D converter is identified by means of a frequency analysis of signals at the outputs of the low-pass filters.

8. A method according to claim 3, wherein identified systematic errors are combined to correcting inverse models for each state of the RF switch separately.

9. A method according to claim 8, wherein the correcting inverse models for separate states of the RF switch are used for creating correction signals in respective states of the RF switch.

10. A method according to claim 1, wherein at every switching of the RF switch, values in the digital corrector are replaced by calculated values before the switching.

11. A method according to claim 1, wherein a sampling frequency is locked to a frequency of the input signal, thus acyclic phase deviations of the locked frequencies are smaller than ten angle degrees.

12. A method according to claim 1, wherein constant error caused by transition effects in the RF unit is evaluated in the circuit for identification of systematic errors, and is compensated with digital corrector.

13. A method according to claim 1, wherein a sequence of states of the RF switch is cyclic whereas a speed of rotation of switching is such that components of amplification asymmetry in output digital signals are eliminated by means of filtering with low-pass filters.

14. A method according to claim 1, wherein a sequence of states of the RF switch is acyclic in a wide frequency range, whereby aliasing is lowered.

15. A method according to claim 1, wherein each digital signal is amplified by an average amplification of all RF processing units.

16. A device for precise measuring of dependency on amplitude and phase of a plurality of high frequency signals, comprising:

a) a radio frequency (RF) switch (3) to which an input thereof is directed a plurality of input signals ($I_1, I_2, \ldots I_N$) originated in accelerator electrodes ($2_1, 2_2, \ldots 2_N$) symmetrically arranged in an evacuated pipe (1);

b) a plurality of RF processing units ($4_1, 4_2, \ldots 4_N$) connected in parallel to the RF switch (3);

c) a plurality of analog-digital (A/D) converters ($5_1, 5_2, \ldots 5_N$) each connected in series to a corresponding one of the plurality of RF processing units ($4_1, 4_2, \ldots 4_N$);

d) a digital corrector (6) connected in series to the plurality of A/D converters ($5_1, 5_2, \ldots 5_N$);

e) a digital switch (8), to an input side thereof is connected in parallel the digital corrector (6) and to an output side thereof is connected a plurality of digital receivers ($9_1, 9_2, \ldots 9_N$);

f) a plurality of low-pass filters ($10_1, 10_2, \ldots 10_N$) each connected in series to a corresponding one of the plurality of digital receivers ($9_1, 9_2, \ldots 9_N$), a respective number of output signals ($O_1, O_2, \ldots O_N$) for further evaluation resulting from the plurality of low-pass filters; and g) a system (7) for identification of systematic errors of separate RF processing units ($4_1, 4_2, \ldots 4_N$) with the respective A/D converter ($5_1, 5_2, \ldots 5_N$) wherein a plurality of inputs of the system (7) is connected with a point of each transition from the digital corrector (6) to digital switch (8) and wherein a plurality of outputs of the system (7) is connected to the digital corrector (6), and wherein the system (7) for identification of systematic errors of separate RF processing units ($4_1, 4_2, \ldots 4_N$) with the respective A/D converter ($5_1, 5_2, \ldots 5_N$) comprising a plurality of parallel digital receivers ($11_1, 11_2, \ldots 11_N$), each input thereof being connected with a point of each transition from the digital receiver ($9_1, 9_2, \ldots 9_N$) to the low-pass filter ($10_1, 10_2, \ldots 10_N$), and which are connected in series to a plurality of low-pass filters ($12_1, 12_2, \ldots 12_N$), wherein the outputs of the low-pass ($10_1, 10_2, \ldots 10_N$) filters are connected in parallel to the inverse model of evaluated systematic errors (14), the outputs thereof being connected to the digital corrector (6).

* * * * *